United States Patent
Kamgaing et al.

(10) Patent No.: US 8,816,906 B2
(45) Date of Patent: Aug. 26, 2014

(54) CHIP PACKAGES INCLUDING THROUGH-SILICON VIA DICE WITH VERTICALLY INEGRATED PHASED-ARRAY ANTENNAS AND LOW-FREQUENCY AND POWER DELIVERY SUBSTRATES

(75) Inventors: Telesphor Kamgaing, Chandler, AZ (US); Valluri R. Rao, Saratoga, CA (US); Yorgos Palaskas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 352 days.

(21) Appl. No.: 13/101,883

(22) Filed: May 5, 2011

(65) Prior Publication Data

US 2012/0280860 A1 Nov. 8, 2012

(51) Int. Cl.
    *H01Q 3/00* (2006.01)
(52) U.S. Cl.
    USPC .......................................................... 342/368
(58) Field of Classification Search
    USPC .......................................................... 342/368
    See application file for complete search history.

(56) References Cited

U.S. PATENT DOCUMENTS

| 8,149,166 B1* | 4/2012 | Buxa ............................ 342/372 |
| 2005/0237267 A1 | 10/2005 | Brown et al. |
| 2008/0029886 A1 | 2/2008 | Cotte et al. |
| 2010/0127937 A1 | 5/2010 | Chandrasekaran et al. |
| 2011/0068433 A1* | 3/2011 | Kim et al. ...................... 257/531 |
| 2011/0148707 A1* | 6/2011 | Thiesen et al. ................ 342/372 |

FOREIGN PATENT DOCUMENTS

| WO | 2012/151003 A2 | 11/2012 |
| WO | 2012/151003 A3 | 3/2013 |

OTHER PUBLICATIONS

Braunish, H, 2002, IEEE, Electronic Components and Technology Conference, 2002. Proceedings 52 nd, pp. 353-358.*
Jazz Semiconductor and UCSD, Jul. 2009, UCSC Jacobs.*
International Search Report and Written Opinion Received for PCT Patent Application No. PCT/US2012/029363, Mailed on Oct. 29, 2013, 9 pages.
International Preliminary Report on Patentability and Written Opinion received for PCT Patent Application No. PCT/US2012/029363, Mailed on Nov. 14, 2013.

* cited by examiner

*Primary Examiner* — Harry Liu
(74) *Attorney, Agent, or Firm* — Winkle, PLLC

(57) ABSTRACT

An apparatus includes a die with through-silicon vias and radio frequency integrated circuit capabilities and it is vertically integrated with a phased-array antenna substrate. The through-silicon via and a radio frequency integrated circuit is coupled to a plurality of antenna elements disposed on the phased-array antenna substrate where each of the plurality of antenna elements is coupled to the through-silicon vias and radio frequency integrated circuit through a plurality of through-silicon vias. A process of assembling the through-silicon vias and radio frequency integrated circuit to the phased-array antenna substrate includes testing the apparatus.

27 Claims, 9 Drawing Sheets

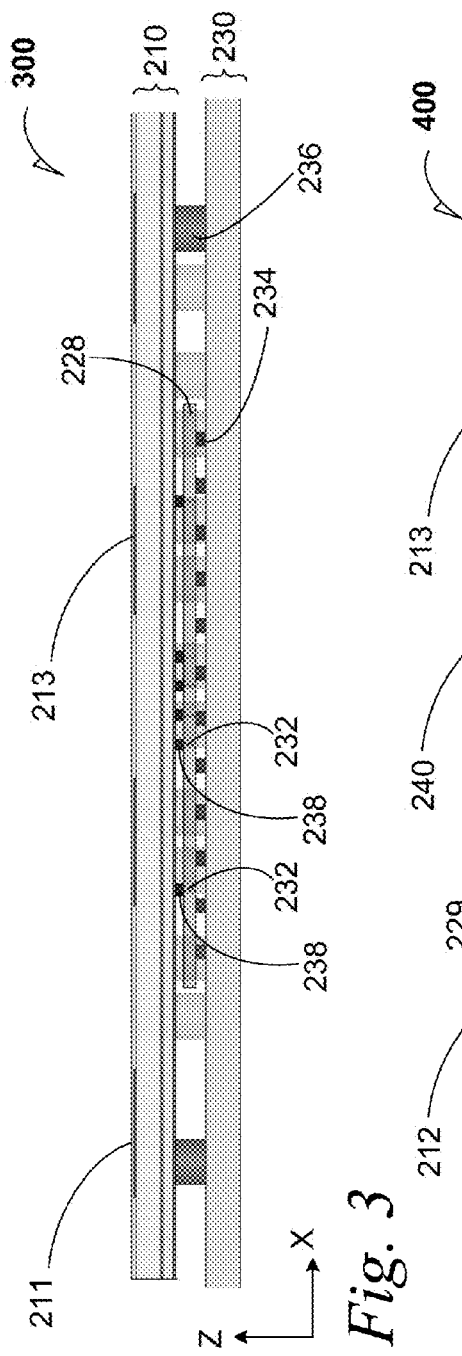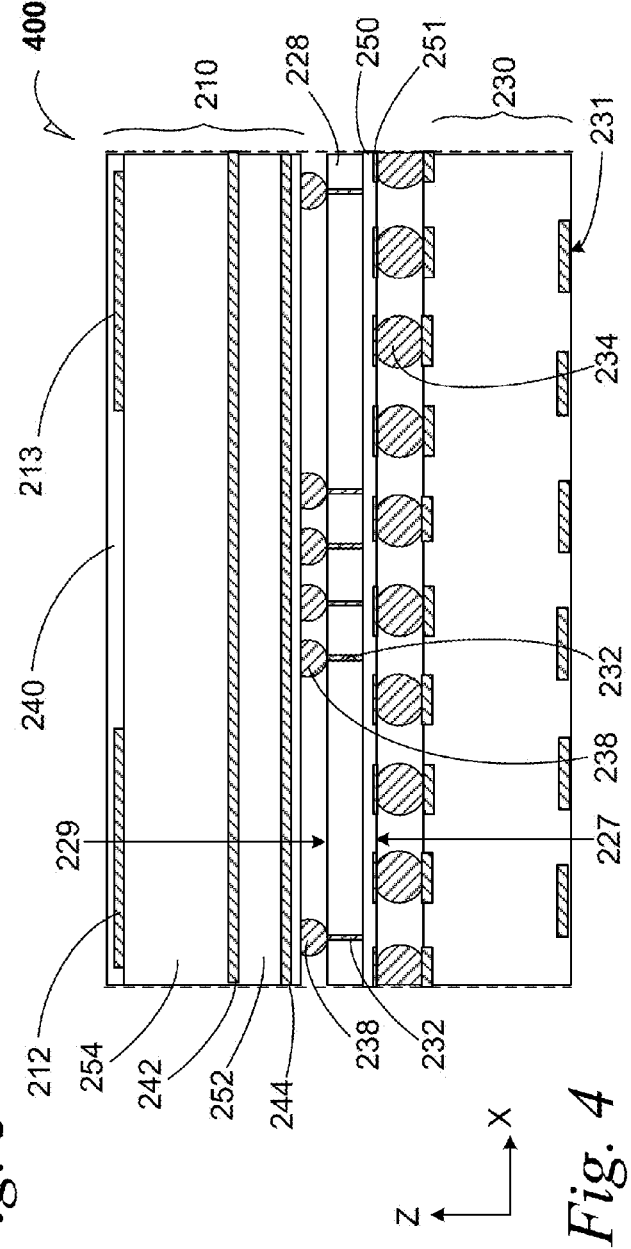

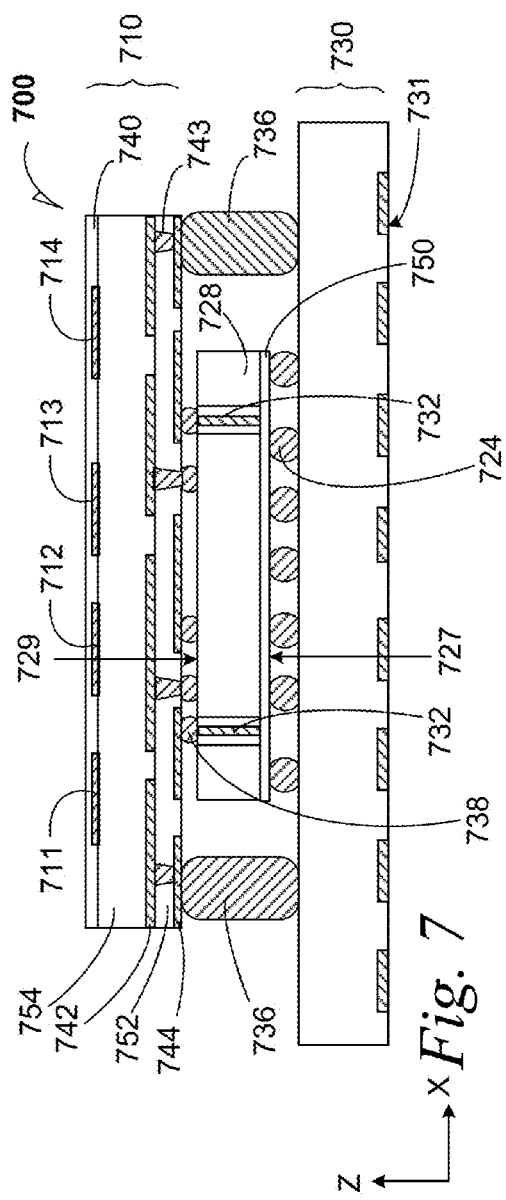
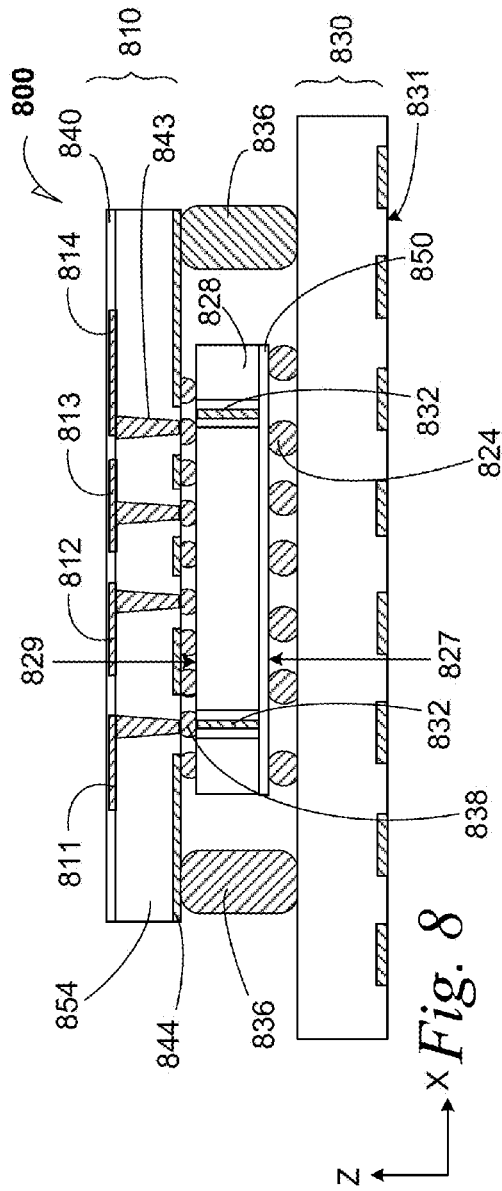

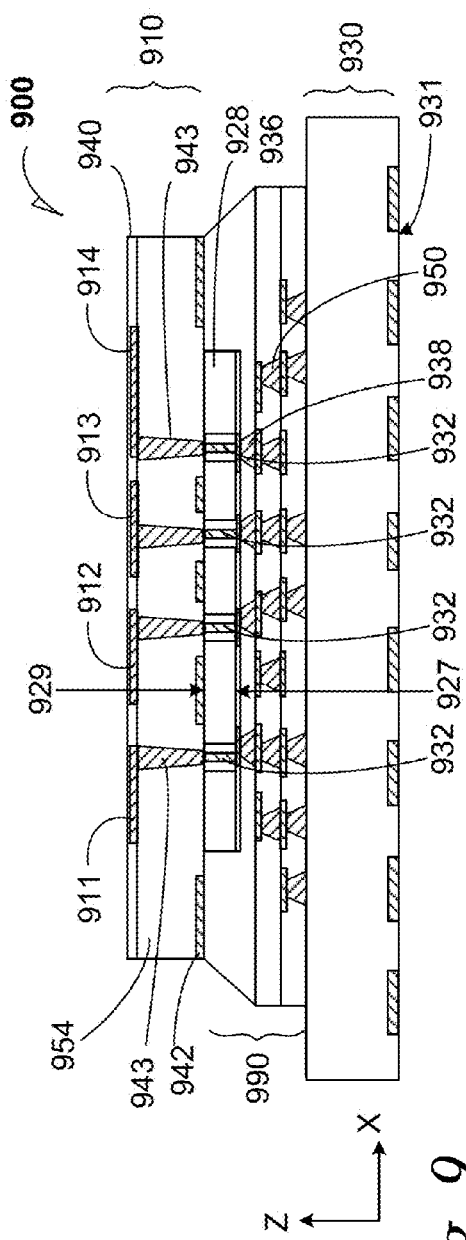
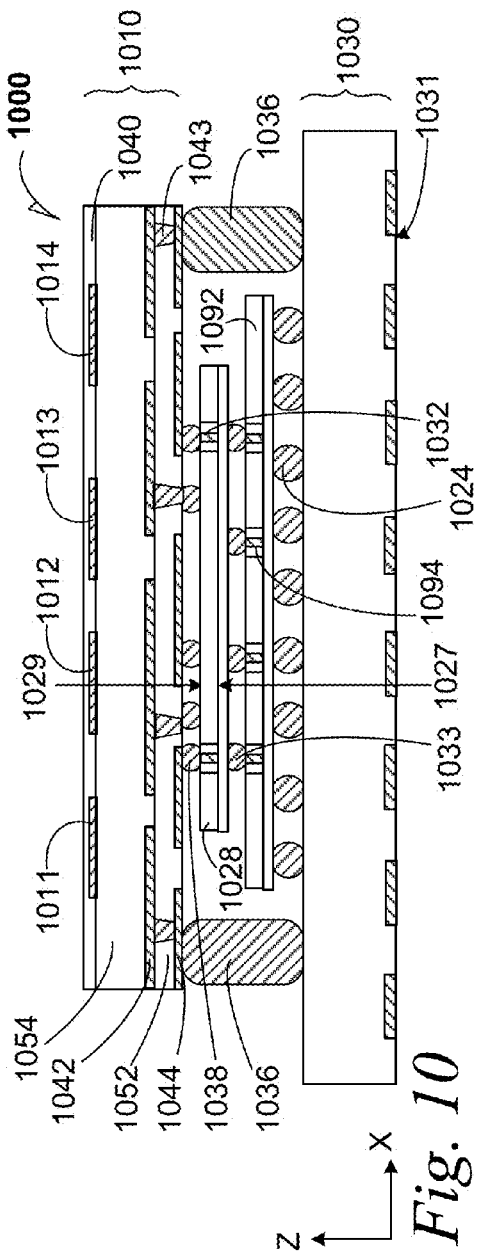
Fig. 9
Fig. 10

CHIP PACKAGES INCLUDING THROUGH-SILICON VIA DICE WITH VERTICALLY INEGRATED PHASED-ARRAY ANTENNAS AND LOW-FREQUENCY AND POWER DELIVERY SUBSTRATES

Disclosed embodiments relate to packaged radio-frequency integrated circuits and methods of forming them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 3 is a cross-section elevation of the phased-array antenna radio-frequency integrated-circuit chip apparatus mounted on a secondary low-cost package depicted in FIG. 2 and taken along the cross-section line 2-2 according to an embodiment FIG. 4 is a detail cross-section elevation of the phased-array antenna radio-frequency integrated-circuit chip apparatus mounted on a secondary low-cost package depicted in FIG. 3 according to an embodiment;

FIG. 7 is a cross-section elevation of a vertically integrated phased-array antenna radio-frequency integrated-circuit chip apparatus mounted on a secondary low-cost package according to an example embodiment;

FIG. 8 is a cross-section elevation of a vertically integrated phased-array antenna radio-frequency integrated-circuit chip apparatus mounted on a secondary low-cost package according to an example embodiment;

FIG. 9 is a cross-section elevation of a vertically integrated phased-array antenna radio-frequency integrated-circuit chip apparatus mounted on a secondary low-cost package according to an example embodiment;

FIG. 10 is a cross-section elevation of a vertically integrated phased-array antenna radio-frequency integrated-circuit chip apparatus that includes a through-silicon via RFIC chip and a TSV processor chip that is mounted on a secondary low-cost package according to an example embodiment;

DETAILED DESCRIPTION

Processes are disclosed where through-silicon-via radio-frequency integrated circuit (TSV RFIC) dice are assembled to phased-array antenna substrates.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1:
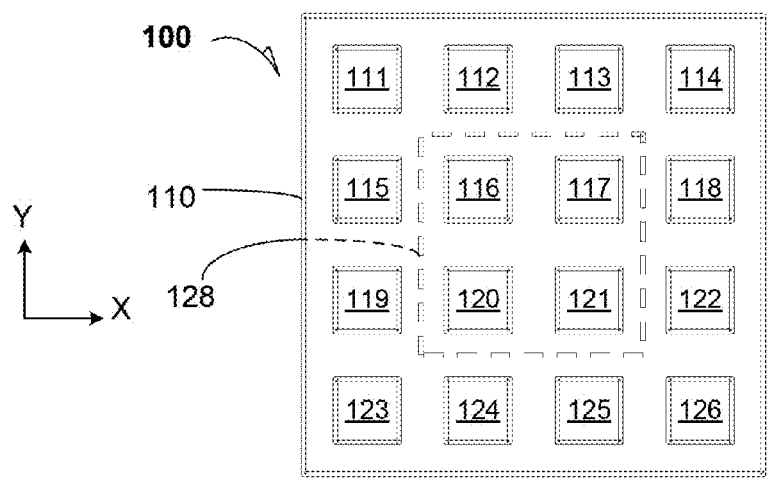
FIG. 1 is top plan of a vertically integrated phased-array antenna radio-frequency integrated-circuit chip apparatus according to an example embodiment.

FIG. 1 is top plan of a phased-array antenna radio-frequency integrated-circuit chip apparatus 100 according to an example embodiment. A phased-array antenna (PAA) substrate 110 is depicted in simplified form with a 4×4 array of planar antenna elements 111, 112, 113, 114, 115, 116, 117, 118, 119, 120, 121, 123, 124, 125, and 126. The PAA elements are deployed in rows of 4-4-4-4. In this embodiment, eight of the PAA elements are receiver elements and 8 PAA elements are transmitter elements. In an embodiment, the number of PAA elements is in a range from 4 to 64. In an embodiment, the number of PAA elements is 36 in a 6×6 array in which 18 PAA elements are receiver elements and 18 PAA elements are transmitter elements. In an embodiment, the number of PAA elements is 64 in a 8×8 array in which 32 PAA elements are receiver elements and 32 PAA elements are transmitter elements. In an embodiment, the 64 elements are split into many arrays. For example, four 4×4 arrays are configured, each from which two antenna elements are configured for Receive and two are configured for Transmit. In an embodiment, a 32-element phased-array antenna is split into many arrays. For example, two 4×4 arrays are configured, each from which two antenna elements are configured for Receive and two are configured for Transmit.

A through-silicon via (TSV) die 128 is depicted in phantom lines below the PAA substrate 110 and the TSV die 128 is vertically integrated (Z-direction) with the PAA substrate 110. In an embodiment, the TSV die 128 includes active and passive circuitry in semiconductive material. For example, the TSV die 128 is part of a processor manufactured by Intel Corporation of Santa Clara, Calif. In an embodiment, the TSV die 128 contains a system-on-chip (SoC) 128 such as a dual-processor microelectronic device. In an embodiment, the TSV die 128 includes a digital processor and radio-frequency integrated circuit (DP-RFIC) hybrid device 128. In an embodiment, the TSV die 128 includes an SoC 128 that includes a DP and a graphics (DP-GIC) hybrid.

In an embodiment, the TSV die 128 is a radio-frequency integrated circuit (RFIC) TSV die 128. It can be seen that the TSV RFIC die 128 has a footprint that is smaller than that of the PAA substrate 110 and that the PAA substrate 110 is symmetrically disposed above the TSV RFIC die 128. As depicted, a quadrilateral symmetry is seen between the PAA substrate 110 and the TSV RFIC die 128. "Quadrilateral symmetry" may be understood to be that starting at the X-Y center of the apparatus 100, a PAA element that is encountered may be balanced by encountering an analogous PAA element when moving in the opposite direction along the same line taken. Although the planar antenna elements are depicted in a quadrilateral symmetry, they may be deployed in other configurations such as in radial symmetry. The planar antenna elements may also be deployed such as in rows of 3-5-5-3, which is a 16-element array that is not a perfect geometrical square although 16 is a perfect numerical square. The planar antenna elements may also be deployed such as in rows of 4-6-6-6-6-4, which is a 32-element array that is not a perfect square.

By being able to dispose the TSV RFIC die 128 directly below the PAA substrate 110, it is useful to achieve more uniform impedances, signal attenuations and phase delay therebetween. Uniform impedances may mean that the apparatus 100 may operate such that no significant differences in line impedance may be observed when comparing operation of any two antenna elements on the PAA substrate in a given application. Additionally by being able to dispose the TSV RFIC die 128 directly below the PAA substrate 110, a useful smaller apparatus is achieved that facilitates miniaturization of packaging.

Figure 2:
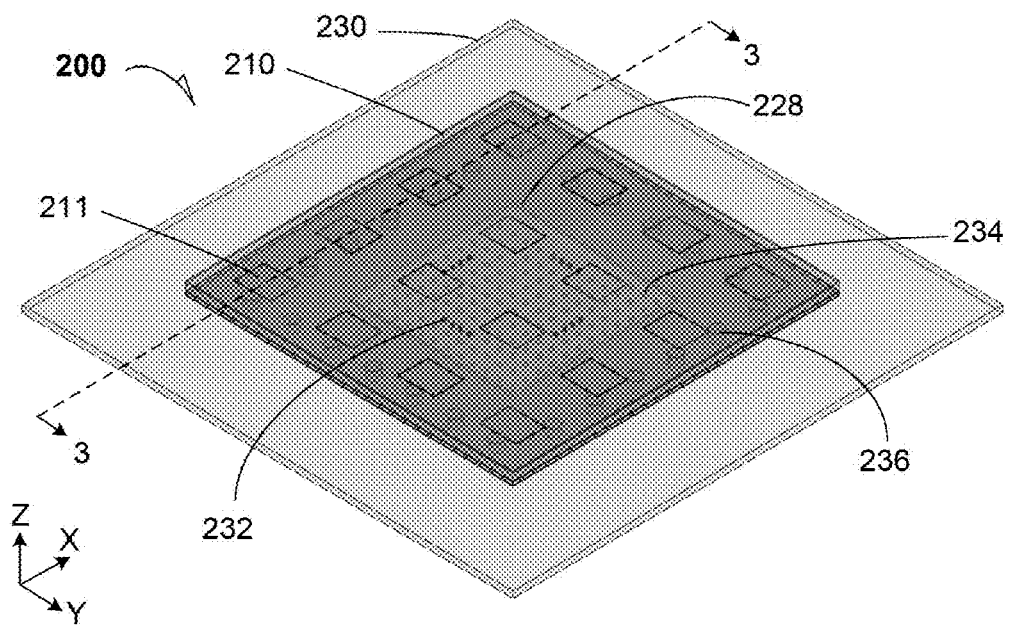
FIG. 2 is a perspective elevation of a phased-array antenna radio-frequency integrated-circuit chip apparatus mounted on a secondary low-cost package according to an embodiment.

FIG. 2 is a perspective elevation of a phased-array antenna radio-frequency integrated-circuit chip apparatus 200 mounted on a secondary low-cost package 230 (also referred to as a board 230) according to an embodiment. In an embodiment, the board 230 is a direct chip-attach (DCA) board 230. Where a secondary low-cost package 230 is used, the removal of RF/mm-wave signals allows a wider pitch to low frequency signals on the board 230. This makes it possible to attach die first-level interconnects such as controlled-collapse chip connection (C4) bumps directly to the board 230.

The apparatus 200 is depicted in partial wire frame in order to illustrate positioning of a TSV RIFC die 228 disposed below (Z-direction) a PAA substrate 210. A 4×4 PAA configuration of planar antennas is disposed on the PAA substrate 210, one of which is indicated with reference numeral 211.

The TSV RFIC die 228 is illustrated with 16 through-silicon vias that are in groups of four, four or which are indicated with reference numeral 232. Each one of the 16 TSVs 232 is coupled to a corresponding planar antenna element such as the planar antenna element 211. Additional TSVs not shown in FIG. 2 may be used to provide proper electrical ground reference to the 16 signal TSVs 232. The TSV RFIC die 228 is flip-chip mounted to a direct chip-attach (DCA) board 230 by a plurality of electrical bumps 234, one of which is indicated with reference numeral 234. The electrical bumps 234 are first-level interconnect bumps such as C4 bumps that are attached to the active side of a die. As illustrated, the electrical bumps are configured in a 12×12 array, but other bump counts may be used where needed. Additional dummy bumps, one of which is indicated with reference numeral 236 are deployed between the PAA substrate 210 and the secondary low-cost package 230. The dummy bumps 236 bridge the gap between the PAA substrate 210 and the secondary low-cost package 230 and add mechanical and thermal-stress stability to the apparatus 200 and the secondary low-cost package 230. In an embodiment, electrical grounding capabilities are achieved through the dummy bumps 236 for at least the PAA substrate 210 and the TSV RFIC 228.

FIG. 3 is a cross-section elevation of the phased-array antenna radio-frequency integrated-circuit chip apparatus 300 mounted on a direct-chip-attach board 230 depicted in FIG. 2 and taken along the cross-section line 3-3 according to an embodiment. The apparatus 300 includes the PAA substrate 210 and the TSV RFIC 228. Additionally, the secondary low-cost package 230 is coupled to the PAA substrate 210 by backside electrical bumps 238. A plurality of TSVs can be seen in the TSV RFIC 228, two of which are indicated with the reference numeral 232. Other structures may be seen in FIG. 3. Where the TSV RFIC 228 is an active RF device with RF and millimeter wave signals being transmitted through TSVs to the phased-array antenna, lower frequency functions are separated from the PAA substrate 210 and contained in the secondary low-cost package 230. This vertical integration system reduces signal congestion and facilitates a small form factor that is limited by dimensions of the PAA substrate 210. In an embodiment, the PAA substrate 210 operates in the 60 GHz realm while the secondary low-cost package 230 operates at lower frequencies.

In an embodiment, a 60 GHz or millimeter-wave phased array or millimeter-wave including the planar antenna elements 211, 212, 213, and 214 is assembled to a millimeter-wave (mm-wave) TSV RFIC 228 that requires a Gb/s datarate over a wireless link. In an embodiment, the wireless link is for a wireless display from a wireless transmission for uncompressed high-definition (HD) video.

FIG. 4 is a cross-section elevation detail of the phased-array antenna radio-frequency integrated-circuit chip apparatus mounted on a direct-chip-attach board depicted in FIG. 3 according to an embodiment. The apparatus 400 includes the PAA substrate 210 and the TSV RFIC 228. The apparatus 400 is mounted on the secondary low-cost package 230.

The PAA substrate 210 is illustrated with two occurrences of the planar antenna elements 212 and 213 that are exposed through an array mask 240. In an embodiment, a metallic layer 242 is disposed in the PAA substrate 210 to enhance antenna bandwidth. Electrical contact between the TSV RFIC 228 and the antenna elements is accomplished through at least one trace 244 that is coupled to the TSVs 232 through backside bumps 238. Electrical coupling of the antenna elements 212 and 213 through the PAA substrate 210 is accomplished either by inductive or direct coupling. In an embodiment, the PAA substrate 210 includes a first dielectric layer 252 and a second dielectric layer 254. In an embodiment, the first dielectric layer 252 has a lower dielectric constant than the second dielectric layer 254.

The TSV RFIC 228 includes an active-device layer 250 that exhibits an active surface 227. The metallization is indicated with a top bond pad 251. The active surface 227 is opposite a die backside surface 229. The metallization layer 251 may also be referred to as the silicon backend 251. In an embodiment, the metallization layer 251 has several layers of metallization such as metal-1 (M1) to M12 depending upon a given need for the TSV RFIC 228. In any event the TSVs 232 originate in the metallization layer 251 and penetrate the TSV RVIC 228 to the backside surface 229 in order to allow the TSV RVIC 228 to communicate with the antenna elements of the PAA substrate 210. The TSVs 232 make electrical contact to the backside bumps 238 and are therefore coupled to the antenna elements 212 and 213.

The secondary low-cost package 230 is coupled to the TSV RFIC 228 by the electrical bumps 234 and to the PAA substrate 210 by the dummy bumps 236 (see FIG. 3). In an embodiment, the secondary low-cost package 230 is a first-level chip-attach substrate and a land surface 231 is provided as a second-level chip-attach surface. In an embodiment, the land surface 231 is a land-grid array surface 231. In an embodiment, the land surface 231 is a pin-grid array surface 231

Figure 5A:
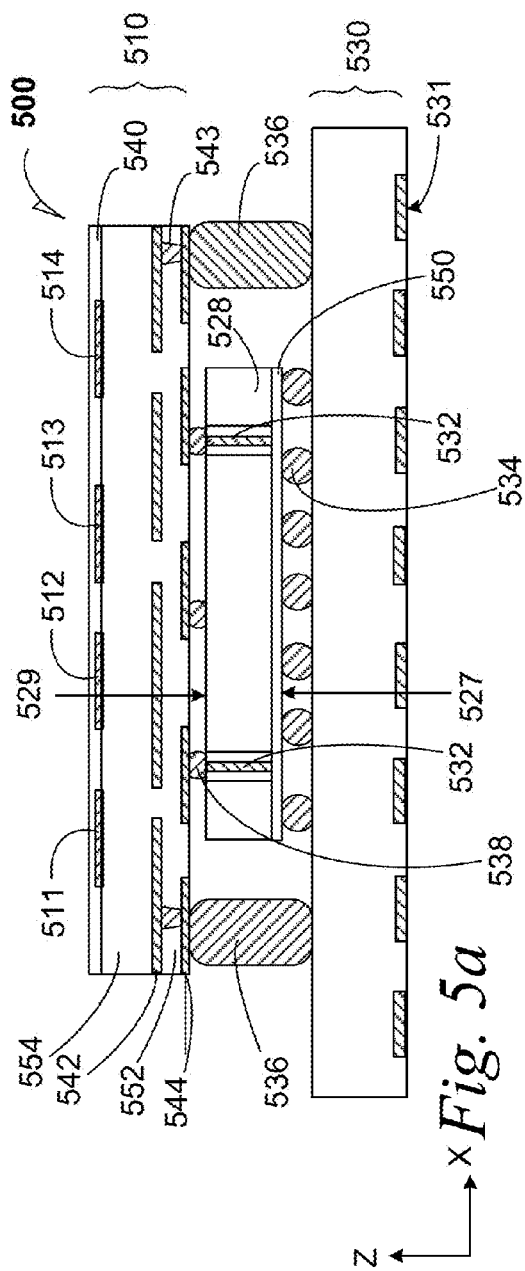
FIG. 5a is a cross-section elevation of a vertically integrated phased-array antenna radio-frequency integrated-circuit chip apparatus mounted on a secondary low-cost package according to an example embodiment.

FIG. 5a is a cross-section elevation of a phased-array antenna radio-frequency integrated-circuit chip apparatus 500 mounted on a direct-chip-attach board according to an example embodiment. The apparatus 500 includes a PAA substrate 510 and a TSV RFIC 528. The TSV RFIC 528 includes an active surface 527 and a backside surface 529 and an active-device layer 550. Additionally, a secondary low-cost package 530 is coupled to the TSV RFIC 528 by backside electrical bumps 538 and to the PAA substrate 510 by the dummy bumps 536. A plurality of TSVs can be seen in the TSV RFIC 528, two of which are indicated with the reference numeral 532.

Other structures may be seen in FIG. 5. The PAA substrate 510 is illustrated with four occurrences of planar antenna elements 511, 512, 513, and 514 that are exposed through an array mask 540. In an embodiment, a metallic layer 542 with apertures is disposed in the PAA substrate 510 as a ground plane to enhance antenna bandwidth. The ground plane 542 is coupled to the dummy bumps 536 through ground vias 543 in the PAA substrate 510.

Electrical contact between the TSV RFIC 528 and the antenna elements is accomplished through at least one trace 544 that is coupled to the TSVs 532 through backside bumps 538. Electrical coupling of the antenna elements 511, 512, 513, and 514 through the PAA substrate 510 is accomplished by inductive coupling. In an embodiment, the PAA substrate 510 includes a first dielectric layer 552 and a second dielectric layer 554. In an embodiment, the first dielectric layer 552 has a lower dielectric constant than the second dielectric layer 554.

Where the TSV RFIC 528 is an active RF device with TSV signals being transmitted to the phased-array antenna elements, lower frequency functions are separated from the PAA substrate 510 and contained in the secondary low-cost package 530. This integration system reduces signal congestion and facilitates a small form factor that is limited by dimensions of the PAA substrate 510. In an embodiment, the PAA substrate 510 operates in the 60 GHz realm while the secondary low-cost package 530 operates at lower frequencies.

In an embodiment, a 60 GHz or millimeter-wave phased array including the planar antenna elements 511, 512, 513, and 514 is assembled to a mm-wave TSV RFIC 528 that requires a Gb/s datarate over a wireless link. In an embodiment, the wireless link is for a wireless display from a wireless transmission for uncompressed HD video. During operation, all RF signals generated within the TSV RFIC 228 are directed through the several TSVs 532 and into the PAA substrate 510 such that the phased-array antenna elements may emit useful signals in a range from zero to 30 meters such as from 1 centimeter to 20 meters according to an embodiment.

Figure 5B:
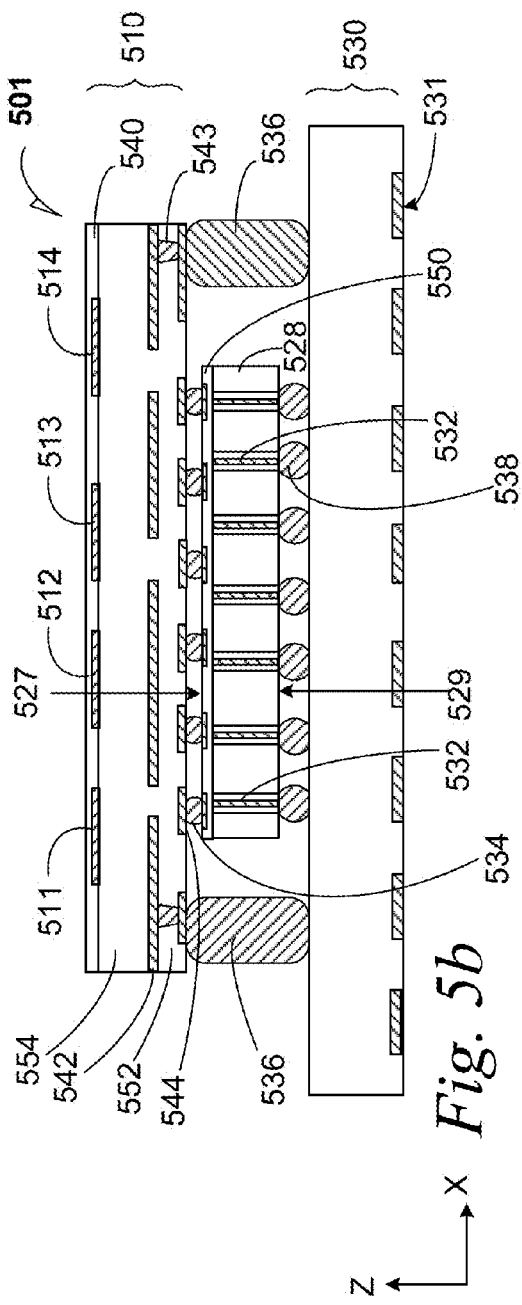
FIG. 5b is a cross-section elevation of a vertically integrated phased-array antenna radio-frequency integrated-circuit chip apparatus mounted on a secondary low-cost package according to an example embodiment.

FIG. 5b is a cross-section elevation of a phased-array antenna radio-frequency integrated-circuit chip apparatus 501 mounted on a direct-chip-attach board according to an example embodiment. The apparatus 501 includes a PAA substrate 510 and a TSV RFIC 528. The TSV RFIC 528 has been configured opposite to that depicted in FIG. 5a such that the configuration of the die 528 consists of flipping the die 528 such that the PAA 510 communicates with the chip 528 through the C4 bumps 534 while the low frequency board 530 receives its signals through the TSVs 532. The TSV RVIC 528 includes an active surface 527 and a backside surface 529 and an active-device layer 550. Additionally, a secondary low-cost package 530 is coupled to the TSV RFIC 528 by backside electrical bumps 538 and to the PAA substrate 510 by the dummy bumps 536. A plurality of TSVs can be seen in the TSV RFIC 528, two of which are indicated with the reference numeral 532.

Other structures may be seen in FIG. 5b. The PAA substrate 510 is illustrated with four occurrences of planar antenna elements 511, 512, 513, and 514 that are exposed through an array mask 540. In an embodiment, a metallic layer 542 with apertures is disposed in the PAA substrate 510 as a ground plane to enhance antenna bandwidth. The ground plane 542 is coupled to the dummy bumps 536 through ground vias 543 in the PAA substrate 510.

Electrical contact between the TSV RFIC 528 and the antenna elements is accomplished through at least one trace 544 that is coupled to the active-surface C4 bumps 534. Electrical coupling of the antenna elements 511, 512, 513, and 514 through the PAA substrate 510 is accomplished by inductive coupling. In an embodiment, the PAA substrate 510 includes a first dielectric layer 552 and a second dielectric layer 554. In an embodiment, the first dielectric layer 552 has a lower dielectric constant than the second dielectric layer 554.

Where the TSV RFIC 528 is an active RF device with TSV signals being transmitted to the phased-array antenna elements, lower frequency functions are separated from the PAA substrate 510 and contained in the secondary low-cost package 530. This integration system reduces signal congestion and facilitates a small form factor that is limited by dimensions of the PAA substrate 510. In an embodiment, the PAA substrate 510 operates in the 60 GHz realm while the secondary low-cost package 530 operates at lower frequencies.

In an embodiment, a 60 GHz or millimeter-wave phased array including the planar antenna elements 511, 512, 513, and 514 is assembled to a mm-wave TSV RFIC 528 that requires a Gb/s datarate over a wireless link. In an embodiment, the wireless link is for a wireless display from a wireless transmission for uncompressed HD video. During operation, all RF signals generated within the TSV RFIC 228 are directed through the several TSVs 532 and into the PAA substrate 510 such that the phased-array antenna elements may emit useful signals in a range from zero to 30 meters such as from 1 centimeter to 20 meters according to an embodiment.

Figure 6:
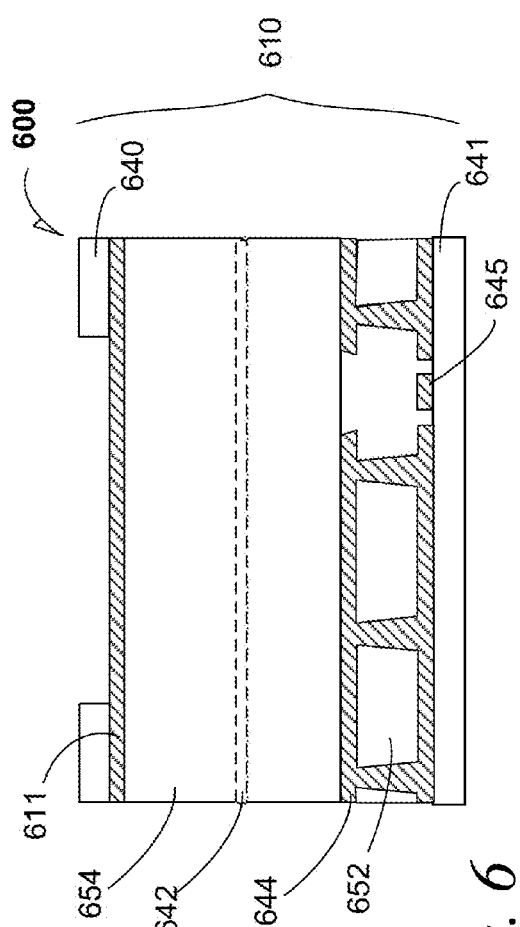
FIG. 6 is a detail cross-section elevation of a top, low-loss phased-array antenna package substrate according to an example embodiment.

FIG. 6 is a detail cross-section elevation of a top, low-loss phased-array antenna 600 according to an example embodiment. The antenna 600 is part of a PAA substrate 610. The PAA substrate 610 is illustrated with one occurrence of a planar antenna element 611 that is exposed through an array mask 640 that may be about 20 micrometer (μm) in thickness. In an embodiment, a metallic layer 642 is disposed in the PAA substrate 610 to enhance antenna bandwidth. Electrical contact between a the TSV RFIC and the antenna element 611 is accomplished through at least one trace 644 that is to be coupled to TSVs through backside bumps that are disposed between a TSV RFIC and the PAA substrate 610. The trace 644 is protected by a solder resist 641 that may have a thickness of about 20 μm. Electrical coupling of the antenna element 611 through the PAA substrate 610 is accomplished by inductive coupling where an emitter trace 645 emits EM waves onto the antenna element 611 though both a high-k dielectric 652 such as a glass material and a lower-k dielectric layer 654 that may also be a glass material. In an embodiment, the first dielectric layer 652 has an Er of about 5.5, a tan_delta of about 0.001, and a thickness of about 100 micrometer (μm) and the lower-k dielectric layer 654 has an Er from about 2.0 to 2.5, a tan_delta of about 0.001, and a thickness from about 250 μm to about 400 μm.

FIG. 7 is a cross-section elevation of a phased-array antenna radio-frequency integrated-circuit chip apparatus

700 mounted on a direct-chip-attach board 730 according to an example embodiment. The apparatus 700 uses aperture feeding to PAA antenna elements. Signals travel through TSVs 732 and through a PAA substrate 710 by inductive coupling to the PAA antenna elements. The apparatus 700 includes a PAA substrate 710 and a TSV RFIC 728. The TSV RFIC 728 includes an active surface 727 and a backside surface 729 and an active-device layer 750. Additionally, a secondary low-cost package 730 is coupled to the TSV RFIC 728 by backside electrical bumps 738 and to the PAA substrate 710 by the dummy bumps 736. A plurality of TSVs can be seen in the TSV RFIC 728, two of which are indicated with the reference numeral 732.

The PAA substrate 710 is illustrated with four occurrences of planar antenna elements 711, 712, 713, and 714 that are exposed through an array mask 740. The number of planar antenna elements may be any set forth in this disclosure and any configuration. In an embodiment, a metallic layer 742 with apertures is disposed in the PAA substrate 710 as a ground plane to enhance antenna bandwidth. The ground plane 742 is coupled to the dummy bumps 736 through ground vias 743 in the PAA substrate 710.

Electrical contact between the TSV RFIC 728 and the antenna elements is accomplished through at least one trace 744 that is coupled to the TSVs 732 through backside bumps 738. Electrical coupling of the antenna elements 711, 712, 713, and 714 through the PAA substrate 710 is accomplished by aperture feeding of an inductive coupling. In an embodiment, the PAA substrate 710 includes a first dielectric layer 752 and a second dielectric layer 754. In an embodiment, the first dielectric layer 7 is glass and has a lower dielectric constant than the second dielectric layer 754 which is also glass.

Where the TSV RFIC 728 is an active RF device with TSV signals being transmitted to the phased-array antenna elements, lower frequency functions are separated from the PAA substrate 710 and contained in the secondary low-cost package 730. This integration system reduces signal congestion and facilitates a small form factor that is limited by dimensions of the PAA substrate 710. In an embodiment, the PAA substrate 710 operates in the 60 GHz realm while the secondary low-cost package 730 operates at lower frequencies.

In an embodiment, a 60 GHz or millimeter-wave phased array including the planar antenna elements 711, 712, 713, and 714 is assembled to a mm-wave TSV RFIC 728 that requires a Gb/s datarate over a wireless link. In an embodiment, the wireless link is for a wireless display from a wireless transmission for uncompressed HD video. During operation, all RF signals generated within the TSV RFIC 728 are directed through the several TSVs 738 and into the PAA substrate 710 such that the phased-array antenna elements may emit useful signals in a range from zero to 30 meters such from 1 centimeter to 20 meters as according to an embodiment.

FIG. 8 is a cross-section elevation of a phased-array antenna radio-frequency integrated-circuit chip apparatus 800 mounted on a direct-chip-attach board 830 according to an example embodiment. The apparatus 800 uses conductive-via feeding to PAA antenna elements. Signals travel through TSVs 732 and through a PAA substrate 710 by conductive vias 843 to PAA antenna elements 811, 812, 813, and 814. The apparatus 800 includes a PAA substrate 810 and a TSV RFIC 828. The TSV RVIC 828 includes an active surface 827 and a backside surface 829 and an active-device layer 850. Additionally, a secondary low-cost package 830 is coupled to the TSV RFIC 828 by backside electrical bumps 838 and to the PAA substrate 810 by dummy bumps 836. A plurality of TSVs can be seen in the TSV RFIC 828, two of which are indicated with the reference numeral 832.

The PAA substrate 810 is illustrated with four occurrences of the planar antenna elements 811, 812, 813, and 814 that are exposed through an array mask 840. The number of planar antenna elements may be any set forth in this disclosure and any configuration. A ground plane 844 is coupled to the dummy bumps 836.

Electrical contact between the TSV RFIC 828 and the antenna elements is accomplished through backside bumps 838 that are in contact with or coupled to the conductive vias 843. In an embodiment, the PAA substrate 810 includes a dielectric layer 854 that is glass.

Where the TSV RFIC 828 is an active RF device with TSV signals being transmitted to the phased-array antenna elements, lower frequency functions are separated from the PAA substrate 810 and contained in the secondary low-cost package 830. This integration system reduces signal congestion and facilitates a small form factor that is limited by dimensions of the PAA substrate 810. In an embodiment, the PAA substrate 810 operates in the 60 GHz realm while the secondary low-cost package 830 operates at lower frequencies.

In an embodiment, a 60 GHz or millimeter-wave phased array including the planar antenna elements 811, 812, 813, and 814 is assembled to a mm-wave TSV RFIC 828 that requires a Gb/s datarate over a wireless link. In an embodiment, the wireless link is for a wireless display from a wireless transmission for uncompressed HD video. During operation, all RF signals generated within the TSV RFIC 828 are directed through the several TSVs 832 and into the PAA substrate 810 such that the phased-array antenna elements may emit useful signals in a range from zero to 30 meters such as from 1 centimeter to 20 meters according to an embodiment.

FIG. 9 is a cross-section elevation of a phased-array antenna radio-frequency integrated-circuit chip apparatus 900 mounted on a direct-chip-attach board according to an example embodiment. The apparatus 900 uses conductive-via 943 feeding to PAA antenna elements and a TSV RFIC 928 is embedded in a bumpless, build-up layer (BBUL) structure 990. Signals travel through TSVs 932 and through a PAA substrate 910 by conductive vias 943 to PAA antenna elements 911, 912, 913, and 914. The conductive vias 943 where they contact the TSVs 932 may be referred to as die backside contact vias 943.

In an embodiment, signals are aperture fed such as illustrated for the PAA substrates 510 and 710, but the PAA substrate is either assembled to a BBUL structure 990 or is integral with a BBUL structure 990. In an example embodiment, the BBUL structure 990 is manufactured separately and later assembled to the PAA substrate 910. In an example embodiment, the BBUL structure 990 is manufactured in a same process as that of the PAA substrate 910.

The apparatus 900 includes a PAA substrate 910 and a TSV RFIC 928 that is embedded in—and integral to the BBUL structure 990. Additionally, a secondary low-cost package 930 is coupled to the TSV RFIC 928 by BBUL die-side vias 938. A plurality of TSVs can be seen in the TSV RFIC 928, four of which are indicated with the reference numeral 932.

The PAA substrate 910 is illustrated with four occurrences of the planar antenna elements 911, 912, 913, and 914 that are exposed through an array mask 940. The number of planar antenna elements may be any set forth in this disclosure and any configuration. A ground plane 942 may be coupled to both the PAA substrate 910 and to the TSV RFIC 928 as well as to the secondary low-cost package 930. Electrical contact between the TSV RFIC 928 and the antenna elements is accomplished through BBUL die-side vias 938 that are in contact with or coupled to the backside conductive vias 943. In an embodiment, the PAA substrate 910 includes a dielectric layer 954 that is glass.

Where the TSV RFIC 928 is an active RF device with TSV signals being transmitted to the phased-array antenna elements, lower frequency functions are separated from the PAA substrate 910 and contained in the secondary low-cost package 930. This integration system reduces signal congestion and facilitates a small form factor that is limited by dimensions of the PAA substrate 910. In an embodiment, the PAA substrate 910 operates in the 60 GHz realm while the secondary low-cost package 930 operates at lower frequencies.

In an embodiment, a 60 GHz or millimeter-wave phased array including the planar antenna elements 911, 912, 913, and 914 is assembled to a mm-wave TSV RFIC 928 that requires a Gb/s datarate over a wireless link. In an embodiment, the wireless link is for a wireless display from a wireless transmission for uncompressed HD video. During operation, all RF signals generated within the TSV RFIC 928 are directed through the several TSVs 932 and into the PAA substrate 910 such that the phased-array antenna elements may emit useful signals in a range from zero to 30 meters such from 1 centimeter to 20 meters as according to an embodiment.

FIG. 10 is a cross-section elevation of a vertically integrated phased-array antenna radio-frequency integrated-circuit chip apparatus 1000 that includes a through-silicon via RFIC chip 1028 and a TSV digital processor chip 1092 that is mounted on a direct-chip-attach board 1030 according to an example embodiment. The apparatus 1000 includes a PAA substrate 1010, a TSV RFIC 1028 and a TSV digital processor (TSV DP) 1092. As depicted, the TSV DP 1092 has a different form factor (depicted in the X-direction) than that of the TSV RFIC 1028. This embodiment illustrates that the two TSV dice 1028 and 1092 may have different form factors when a given application of vertically integrated dice is useful in connection with vertical integration with a phased-array antenna substrate. In an embodiment, it may be understood that the form-factor difference is such that the TSV RFIC 1028 is larger than that of the TSV DP 1092. In an embodiment, it may be understood that the form factors of the two dice are substantially the same.

In an embodiment, where the TSV RFIC 1028 may bear a majority (more than 50 percent) or a plurality (less than 50 percent, but the largest amount) of the burden for RF signal processing, the TSV DP 1092 may be a processor such as that manufactured by Intel Corporation of Santa Clara, Calif. In an embodiment, the TSV DP 1092 has dual-processor functions such as a dual core processor. In an embodiment, the TSV DP 1092 has dual-processor dissimilar functions such as a digital-sector and a graphics-sector processor such as the processor type code-named "Sandy Bridge" manufactured by Intel Corporation.

A secondary low-cost package 1030 is coupled to the TSV DP 1092 by electrical bumps 1024 and to the PAA substrate 1010 by dummy bumps 1036. A plurality of TSVs can be seen in the TSV RFIC 1028, one of which is indicated with the reference numeral 1032. Similarly, a plurality of TSVs can be seen in the TSV DC 1092, one of which is indicated with the reference numeral 1094 and the two dice 1028 and 1092 are coupled at the respective TSVs by an electrical bump 1033.

In an embodiment, a metallic layer 1042 with apertures is disposed in the PAA substrate 1010 as a ground plane to enhance antenna bandwidth. The ground plane 1042 is coupled to the dummy bumps 1036 through ground vias 1043 in the PAA substrate 1010. In an embodiment, the apparatus 1000 may use conductive-via feeding such as is illustrate in FIGS. 8 and 9.

The PAA substrate 1010 is illustrated with four occurrences of the planar antenna elements 1011, 1012, 1013, and 1014 that are exposed through an array mask 1040. The number of planar antenna elements may be any set forth in this disclosure and any configuration. Electrical contact between the TSV RFIC 1028 and the antenna elements is accomplished through backside bumps 1038. In an embodiment, the PAA substrate 1010 includes a first dielectric layer 1052 and a second dielectric layer 1054. In an embodiment, the first dielectric layer 1052 has a lower dielectric constant than the second dielectric layer 1054.

Where the TSV RFIC 1028 is an active RF device with TSV signals being transmitted to the phased-array antenna elements PAA substrate 1010, lower frequency functions are separated from the PAA substrate 1010 and contained in the secondary low-cost package 1030. This integration system reduces signal congestion and facilitates vertical integration of two dice 1028 and 1092 below a PAA and a small form factor that is limited by dimensions of the PAA substrate 1030. In an embodiment, the PAA substrate 1010 operates in the 60 GHz/mm-wave realm while the secondary low-cost package 1030 operates at lower frequencies.

In an embodiment, a 60 GHz or millimeter-wave phased array including the planar antenna elements 1011, 1012, 1013, and 1014 is assembled to a mm-wave TSV RFIC 1028 that requires a Gb/s datarate over a wireless link. In an embodiment, the wireless link is for a wireless display from a wireless transmission for uncompressed HD video. During operation, all RF signals generated within the TSV RFIC 1028 are directed through the several TSVs 1032 and into the PAA substrate 1010 such that the phased-array antenna elements may emit useful signals in a range from zero to 30 meters such as from 1 centimeter to 20 meters according to an embodiment.

It may now be appreciated that vertically integrated dice including a TSV RFIC and a TSV DC may be assembled an integral to a BBUL structure, which in turn may be assembled to—or be integral to a PAA substrate. Further, an apparatus that includes a BBUL-integral TSV RFIC and TSV DC may be assembled to a secondary low-cost package.

Figure 11:
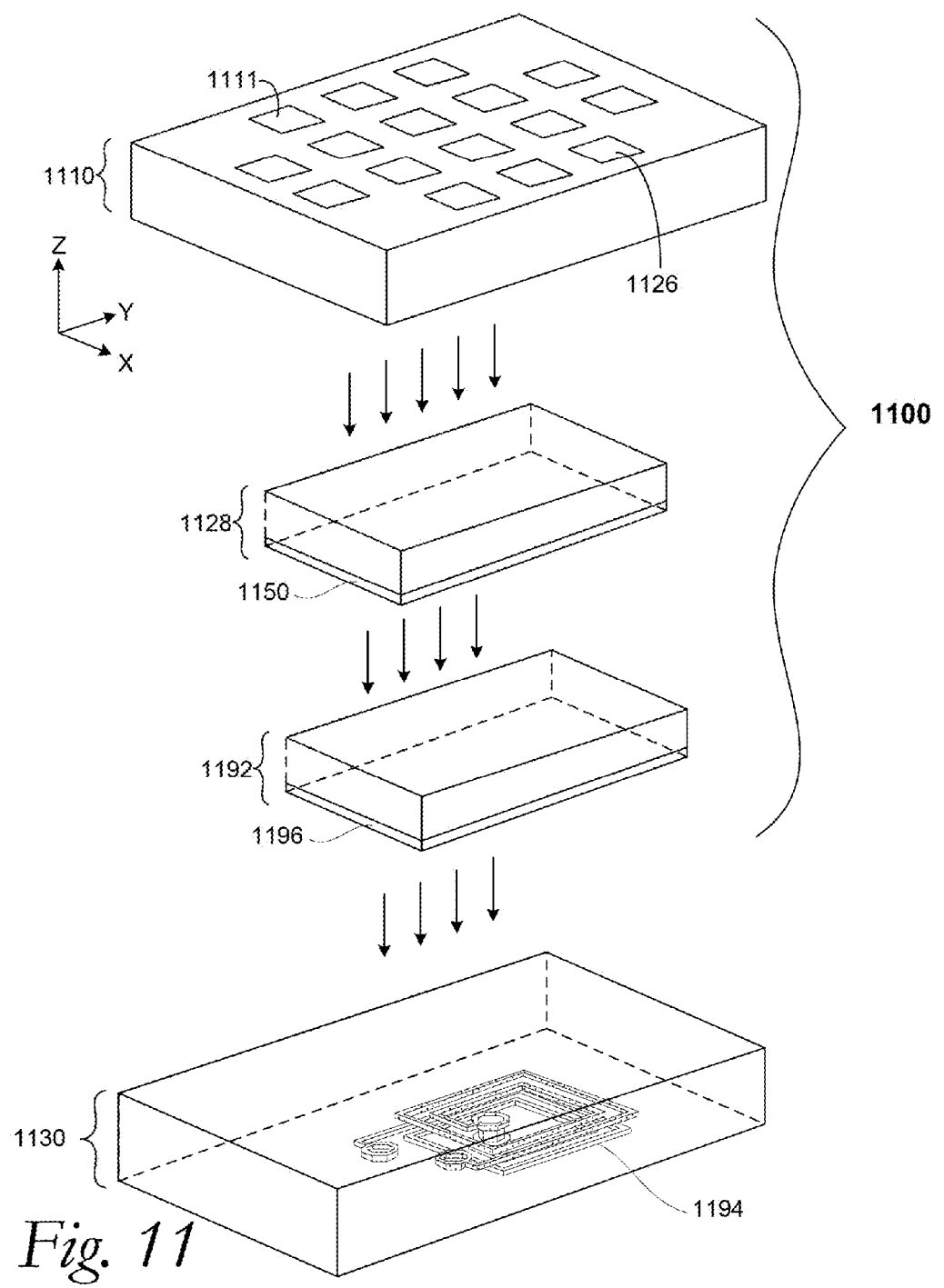
FIG. 11 is an exploded, wire-frame perspective of a phased-array antenna radio-frequency integrated-circuit chip apparatus that includes a through-silicon via RFIC chip that is mounted on a secondary low-cost package with an embedded passive device according to an example embodiment.

FIG. 11 is an exploded, wire-frame perspective of a phased-array antenna radio-frequency integrated-circuit chip apparatus 1100 that includes a through-silicon via RFIC chip 1128 that is mounted on a direct-chip-attach board 1130 with an embedded passive device 1194 according to an example embodiment. As depicted, the apparatus 1100 is configured with an TSV RFIC 1128 and a PAA substrate 1110. The PAA substrate 1110 is depicted with 16 antenna elements 111 to 1126 in a 3-5-5-3 (X-direction) configuration.

The TSV RFIC 1128 is disposed on the secondary low-cost package 1130 and a passive device 1194, in this illustration a folded inductor 1194, is embedded in the secondary low-cost package 1130. In an embodiment, the apparatus includes the PAA substrate 1110, the TSV RFIC 1128, and also a TSV DP 1192. In an embodiment, only the PAA substrate 1110 and the TSV RFIC 1128 are present. The apparatus 1100 is depicted in simplified form that includes TSV DP metallization 1998 that supports the TSV DP 1192 and RFIC metallization 1150 that supports the TSV RFIC 1128.

In an embodiment, the secondary low-cost package 1130 is a coreless substrate 1130 that includes at least one passive device embedded therein. Electrical communication between the DP-RFIC 1192 and the secondary low-cost package 1130 is carried out through electrical bumps according to any disclosed embodiment or otherwise according to known technique. As illustrated, the DP-RFIC 1192, if present, is a flip-chip 1192 that is being mated to the secondary low-cost package 1130 by use of electrical bumps according to any disclosed embodiment or otherwise according to known technique. Other passive devices may be embedded in the secondary low-cost package according to any technique disclosed in PCT Patent Application No. PCT/US2010/061388, filed Dec. 20, 2010 by two of the named inventors in this instant disclosure, the disclosure of which is incorporated herein in its entirety by reference.

Any RF-quality capacitors may be deployed within the silicon of the TSV RFIC 1128 according to an embodiment. As a front-end module passive device, at least one RF-quality capacitor is deployed within the TSV RFIC 1128, remains within the silicon of the TSV RFIC 1128 where it may be fabricated with a high-k dielectric material for a useful capacitance and a useful small size compared to that of inductors that may be deployed within the secondary low-cost package 1130, between the TSV RFIC 1128 and the secondary low-cost package 1130.

Figure 12:
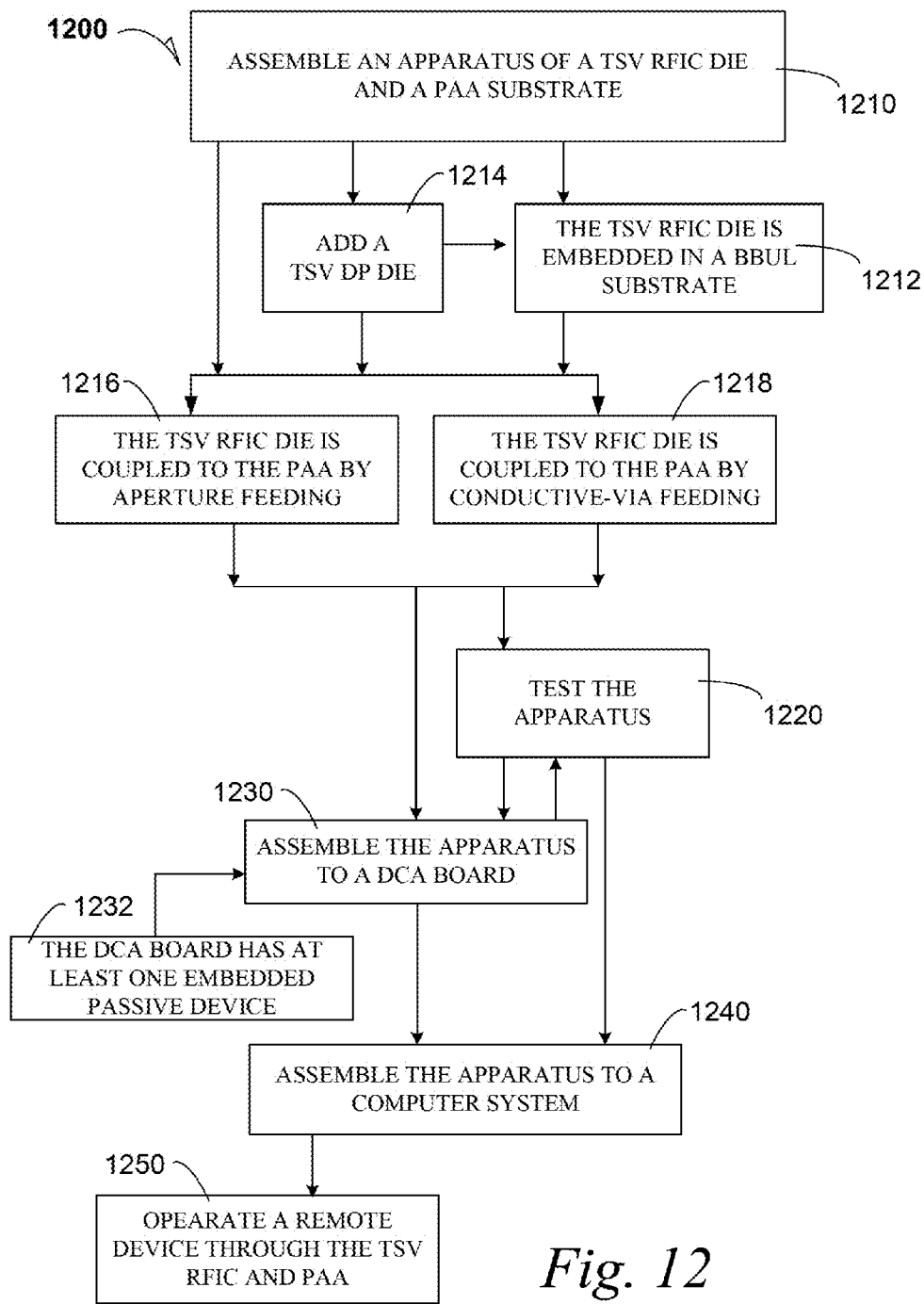
FIG. 12 is a process and method flow diagram according to an example embodiment.

FIG. 12 is a process and method flow diagram 1200 according to an example embodiment.

At 1210, the process includes assembling an apparatus of a through-silicon via die and a phased-array antenna substrate. In a non-limiting example embodiment, the TSV RFIC 228, depicted in FIG. 3, is assembled to a PAA substrate 210.

At 1212, a process embodiment includes embedding the TSV RFIC in a bumpless build-up layer substrate. In a non-limiting example embodiment, the BBUL substrate 990, depicted in FIG. 9, is assembled to the PAA substrate 910.

At 1214, a process embodiment includes assembling or adding a through-silicon via digital processor to the apparatus. In a non-limiting example embodiment, the TSV DP 1092 is added to the TSV RFIC 1028 as depicted in FIG. 1000.

At 1216, a process includes assembling the TSV RFIC to a PAA substrate such that electrical coupling is by aperture feeding between the TSV RFIC and the planar antenna elements of the PAA. In a non-limiting example embodiment, aperture feeding couples the PAA substrate 510, depicted in FIG. 5, to the TSV RFIC 528.

At 1218, a process includes assembling the TSV RFIC to a PAA substrate such that electrical coupling is by conductive-via feeding between the TSV RFIC and the planar antenna elements of the PAA. In a non-limiting example embodiment, conductive-via feeding is used on the apparatus 800, depicted in FIG. 8.

At 1220, a method embodiment includes testing the apparatus. In a non-limiting example embodiment, the apparatus that consists essentially of the PAA substrate mated to the TSV RFIC is tested before assembling the apparatus to a secondary low-cost package. For example, a testing jig may have a similar electrical-contact footprint of that of the TSV RFIC such that testing may be done without a permanent secondary low-cost package affixed.

At 1230, a process embodiment includes assembling the apparatus to a secondary low-cost package. In a non-limiting example embodiment, testing at 1220 is done after assembling the apparatus to the secondary low-cost package.

At 1232, a process embodiment includes fabricating at least one passive device in or on the secondary low-cost package. In a non-limiting example embodiment, the folded inductor 1194 is fabricated into a coreless secondary low-cost package 1130 as depicted in FIG. 11. In an embodiment, a bump inductor is deployed between the secondary low-cost package and the TSV RFIC. In an embodiment, a stacked-via inductor is deployed between the TSV RFIC and at least partially in the secondary low-cost package 1130.

At 1240, a method embodiment includes assembling the apparatus to a computer system. In a non-limiting example embodiment, the computer system depicted in FIG. 13 has functionalities of an antenna element such as any disclosed PAA and their art-recognized equivalents in connection with this disclosure.

At 1250, a method embodiment includes operating a remote device through a TSV RFIC and PAA apparatus. In an embodiment, a remote device 1384 is operated by an apparatus embodiment by use of PAA elements 1382.

Figure 13:
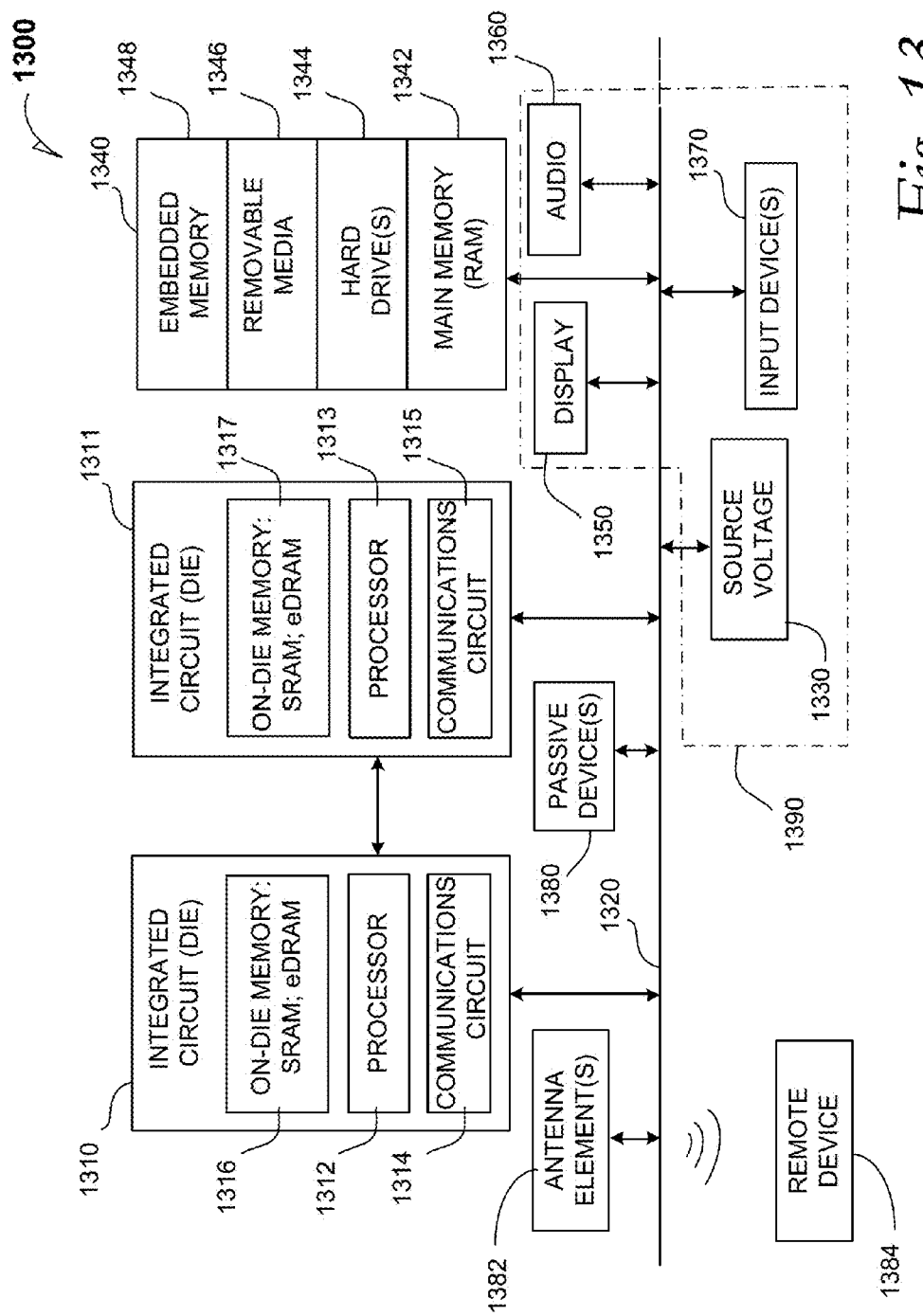
FIG. 13 is a schematic of a computer system according to an embodiment.

FIG. 13 is a schematic of a computer system according to an embodiment.

The computer system 1300 (also referred to as the electronic system 1300) as depicted can embody an apparatus that includes a TSV RFIC mated to a PAA substrate according to any of the several disclosed embodiments and their equivalents as set forth in this disclosure. An apparatus that includes a TSV RFIC mated to a PAA substrate is assembled to a computer system. The computer system 1300 may be a mobile device such as a netbook computer. The computer system 1300 may be a mobile device such as a wireless smart phone. The computer system 1300 may be a desktop computer. The computer system 1300 may be a hand-held reader. The computer system 1300 may be integral to an automobile. The computer system 1300 may be integral to a television. The computer system 1300 may be integral to a dvd player. The computer system 1300 may be integral to a digital camcorder.

In an embodiment, the electronic system 1300 is a computer system that includes a system bus 1320 to electrically couple the various components of the electronic system 1300. The system bus 1320 is a single bus or any combination of busses according to various embodiments. The electronic system 1300 includes a voltage source 1330 that provides power to the integrated circuit 1310. In some embodiments, the voltage source 1330 supplies current to the integrated circuit 1310 through the system bus 1320.

The integrated circuit 1310 is electrically coupled to the system bus 1320 and includes any circuit, or combination of circuits according to an embodiment. In an embodiment, the integrated circuit 1310 includes a processor 1312 that can be of any type of an apparatus that includes a TSV RFIC mated to a PAA substrate embodiment. As used herein, the processor 1312 may mean any type of circuit such as, but not limited to, a microprocessor, a microcontroller, a graphics processor, a digital signal processor, or another processor. In an embodiment, the processor 1312 is the BBUL embedded TSV RFIC die disclosed herein. In an embodiment, SRAM embodiments are found in memory caches of the processor. Other types of circuits that can be included in the integrated circuit 1310 are a custom circuit or an application-specific integrated circuit (ASIC), such as a communications circuit 1314 for use in wireless devices such as cellular telephones, smart phones, pagers, portable computers, two-way radios, and similar electronic systems. In an embodiment, the processor 1310 includes on-die memory 1316 such as static random-access memory (SRAM). In an embodiment, the processor 1310 includes embedded on-die memory 1316 such as embedded dynamic random-access memory (eDRAM).

In an embodiment, the integrated circuit 1310 is complemented with a subsequent integrated circuit 1311 such as a graphics processor or a radio-frequency integrated circuit or both as set forth in this disclosure. In an embodiment, the dual integrated circuit 1310 includes embedded on-die memory 1317 such as eDRAM. The dual integrated circuit 1311 includes an RFIC dual processor 1313 and a dual communications circuit 1315 and dual on-die memory 1317 such as SRAM. In an embodiment, the dual communications circuit 1315 is particularly configured for RF processing.

In an embodiment, at least one passive device 1380 is coupled to the subsequent integrated circuit 1311 such that the integrated circuit 1311 and the at least one passive device are part of the any apparatus embodiment that includes a TSV RFIC mated to a PAA substrate that includes the integrated circuit 1310 and the integrated circuit 1311.

In an embodiment, the electronic system 1300 includes an antenna element 1382 such as any PAA embodiment set forth in this disclosure. By use of the antenna element 1382 such as any PAA embodiment set forth in this disclosure, a remote device 1384 such as a television, may be operated remotely through a wireless link by an apparatus embodiment. For example, an application on a smart telephone that operates through a TSV RFIC and PAA substrate broadcasts instructions through a wireless link to a television up to about 30 meters distant such as by Bluetooth® technology.

In an embodiment, the electronic system 1300 also includes an external memory 1340 that in turn may include one or more memory elements suitable to the particular application, such as a main memory 1342 in the form of RAM, one or more hard drives 1344, and/or one or more drives that handle removable media 1346, such as diskettes, compact disks (CDs), digital variable disks (DVDs), flash memory drives, and other removable media known in the art. The external memory 1340 may also be embedded memory 1348 such an apparatus that includes a TSV RFIC mated to a PAA substrate according to any disclosed embodiment.

In an embodiment, the electronic system 1300 also includes a display device 1350, and an audio output 1360. In an embodiment, the electronic system 1300 includes an input device such as a controller 1370 that may be a keyboard, mouse, touch pad, keypad, trackball, game controller, microphone, voice-recognition device, or any other input device that inputs information into the electronic system 1300. In an embodiment, an input device 1370 includes a camera. In an embodiment, an input device 1370 includes a digital sound recorder. In an embodiment, an input device 1370 includes a camera and a digital sound recorder.

A foundation substrate 1390 may be part of the computing system 1300. In an embodiment, the foundation substrate 1390 is a motherboard that supports an apparatus that includes a TSV RFIC mated to a PAA substrate. It may be understood that a secondary low-cost package may be part of the computer system 1300 as well as a motherboard onto which the secondary low-cost package is assembled. In an embodiment, the foundation substrate 1390 is a board which supports an apparatus that includes a TSV RFIC mated to a PAA substrate. In an embodiment, the foundation substrate 1390 incorporates at least one of the functionalities encompassed within the dashed line 1390 and is a substrate such as the user shell of a wireless communicator.

As shown herein, the integrated circuit 1310 can be implemented in a number of different embodiments, an apparatus that includes a TSV RFIC mated to a PAA substrate according to any of the several disclosed embodiments and their equivalents, an electronic system, a computer system, one or more methods of fabricating an integrated circuit, and one or more methods of fabricating and assembling an apparatus that includes a TSV RFIC mated to a PAA substrate according to any of the several disclosed embodiments as set forth herein in the various embodiments and their art-recognized equivalents. The elements, materials, geometries, dimensions, and sequence of operations can all be varied to suit particular I/O coupling requirements including a semiconductive substrate that is metalized with at least one self-formed, self-aligned barrier embodiments and their equivalents.

Although a die may refer to a processor chip, an RF chip, an RFIC chip, IPD chip, or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus, comprising:
- a die including a through-silicon via and a radio frequency integrated circuit (TSV RFIC die);
- a phased-array antenna (PAA) substrate vertically integrated with the TSV RFIC, wherein the PAA substrate includes a plurality of antenna elements, each of which is coupled to the TSV RFIC through a plurality of TSVs;
- a first-level interconnect substrate onto which the TSV RFIC is mounted, wherein the TSV RFIC includes an active surface and a backside surface;
- a plurality of plurality of electrical bumps disposed between the active surface and the first-level interconnect substrate, wherein the first-level interconnect substrate is a secondary package substrate; and
- a plurality of backside bumps disposed between the backside surface and the PAA substrate.

2. The apparatus of claim 1, wherein the first-level interconnect substrate includes at least one passive device embedded therein that functions with the TSV RFIC.

3. The apparatus of claim 1, wherein the plurality of antenna elements in the PAA substrate is coupled to the TSV RFIC through inductive-coupling apertures in the PAA substrate.

4. The apparatus of claim 1, wherein the plurality of antenna elements in the PAA substrate is coupled to the TSV RFIC through via-coupling in the PAA substrate.

5. The apparatus of claim 1, wherein the PAA substrate includes a first dielectric layer and a second dielectric layer, wherein the first dielectric layer is closer to the plurality of antenna elements and the second dielectric layer is closer to the TSV RFIC, and where the first dielectric layer has a lower dielectric constant than the second dielectric layer.

6. The apparatus of claim 1, wherein the PAA substrate includes a first dielectric layer and a second dielectric layer, wherein the first dielectric layer is glass and is closer to the plurality of antenna elements and the second dielectric layer is glass and is closer to the TSV RFIC, and where the first dielectric layer has a lower dielectric constant than the second dielectric layer.

7. The apparatus of claim 1, wherein the PAA substrate includes an embedded ground plane coupled to the plurality of antenna elements and also coupled to the TSV RFIC.

8. The apparatus of claim 7, further including:
at least one dummy bump disposed between the PAA substrate and the substrate onto which the TSV RFIC is mounted.

9. The apparatus of claim 1, wherein the TSV RFIC is embedded in a bumpless, build-up layer (BBUL) that is coupled to the PAA substrate.

10. The apparatus of claim 1, wherein the TSV RFIC is embedded in a BBUL that is coupled to the PAA substrate, and wherein the plurality of antenna elements in the PAA substrate is coupled to the TSV RFIC through inductive-coupling apertures in the PAA substrate.

11. The apparatus of claim 1, wherein the TSV RFIC is embedded in a BBUL that is coupled to the PAA substrate, and wherein the plurality of antenna elements in the PAA substrate is coupled to the TSV RFIC through via-coupling in the PAA substrate.

12. The apparatus of claim 1, wherein the TSV RFIC is embedded in a BBUL that is coupled to the PAA substrate, further including a first-level interconnect substrate onto which the TSV RFIC is mounted, and wherein the first-level interconnect substrate includes at least one passive device embedded therein that functions with the TSV RFIC.

13. The apparatus of claim 1, further including a through-silicon via digital processor die (TSV DP) coupled to the TSV RFIC through at least one TSV in the TSV RFIC and at least one TSV in the TSV DP, and wherein the TSV DP and the TSV RFIC are vertically integrated below the PAA substrate.

14. The apparatus of claim 1, further including a through-silicon via digital processor die (TSV DP) coupled to the TSV RFIC through at least one TSV in the TSV RFIC and at least one TSV in the TSV DP, and wherein the TSV DP and the TSV RFIC are vertically integrated below the PAA substrate, wherein the PAA substrate includes an embedded ground plane coupled to the plurality of antenna elements and also coupled to the TSV RFIC.

15. An apparatus, comprising:
a die including a through-silicon via and a radio frequency integrated circuit (TSV RFIC die);
a phased-array antenna (PAA) substrate vertically integrated with the TSV RFIC, wherein the PAA substrate includes a plurality of antenna elements, each of which is coupled to the TSV RFIC through a plurality of TSVs;
a through-silicon via digital processor die (TSV DP) coupled to the TSV RFIC through at least one TSV in the TSV RFIC and at least one TSV in the TSV DP, and wherein the TSV DP and the TSV RFIC are vertically integrated below the PAA substrate;
a first-level interconnect substrate onto which the TSV DP is mounted, wherein the PAA substrate includes an embedded ground plane coupled to the plurality of antenna elements and also coupled to the TSV RFIC; and
at least one dummy bump disposed between the PAA substrate and the substrate onto which the TSV RFIC is mounted.

16. The apparatus of claim 15, wherein the first-level interconnect substrate includes at least one passive device embedded therein that functions with the TSV RFIC.

17. A process of forming a vertically integrated apparatus comprising:
assembling a through-silicon via radio-frequency integrated circuit die (TSV RFIC) to a phased-array antenna (PAA) substrate, wherein the PAA substrate includes a plurality of antenna elements, and wherein assembling includes coupling each antenna element to a TSV in the TSV RFIC;
mounting the TSV RFIC to a first-level interconnect substrate, wherein the TSV RFIC includes an active surface and a backside surface by disposing a plurality of plurality of electrical bumps between the active surface and the first-level interconnect substrate, wherein the first-level interconnect substrate is a secondary package substrate; and
disposing a plurality of backside bumps between the backside surface and the PAA substrate.

18. The process of claim 17, further including:
testing the apparatus, followed by;
mounting the TSV RFIC to the first-level interconnect.

19. The process of claim 17, further including:
testing the apparatus, after mounting the TSV RFIC to the first-level interconnect.

20. The process of claim 17, wherein before assembling the TSV RFIC to the PAA substrate, the TSV is first embedded in a bumpless, build-up layer (BBUL).

21. The process of claim 17, further including assembling a through-silicon via digital processor to the TSV RFIC die.

22. The process of claim 17, further including assembling the apparatus to a computing system.

23. The process of claim 17, further including operating a remote device through the apparatus.

24. A computer system comprising:
a die including a through-silicon via and a radio frequency integrated circuit (TSV RFIC die);
a phased-array antenna (PAA) substrate vertically integrated with the TSV RFIC, wherein the PAA substrate includes a plurality of antenna elements, each of which is coupled to the TSV RFIC through a plurality of TSVs;
a first-level interconnect substrate onto which the TSV RFIC is mounted, wherein the TSV RFIC includes an active surface and a backside surface;
a plurality of plurality of electrical bumps disposed between the active surface and the first-level interconnect substrate, wherein the first-level interconnect substrate is a secondary package substrate;
a plurality of backside bumps disposed between the backside surface and the PAA substrate; and
a foundation substrate that supports the first-level interconnect substrate.

25. The computer system of claim 24, wherein the foundation substrate is part of a mobile device.

26. The computer system of claim 24, wherein the foundation substrate is part of a vehicle.

27. The computer system of claim 24, wherein the foundation substrate is part of a television.

\* \* \* \* \*